United States Patent [19]

Rippingale

[11] Patent Number: 4,639,674
[45] Date of Patent: Jan. 27, 1987

[54] APPARATUS AND METHOD EMPLOYING EXTRANEOUS FIELD COMPENSATION FOR LOCATING CURRENT-CARRYING OBJECTS

[75] Inventor: John B. Rippingale, Leesburg, Va.
[73] Assignee: Schonstedt Instrument Company, Reston, Va.
[21] Appl. No.: 483,613
[22] Filed: Apr. 11, 1983
[51] Int. Cl.$^4$ .................. G01R 19/00; G01V 3/08; G01V 3/10
[52] U.S. Cl. ........................ 324/326; 324/67
[58] Field of Search ............ 324/66, 67, 326, 327, 324/328, 329, 244

[56] References Cited

U.S. PATENT DOCUMENTS

| | | | |
|---|---|---|---|
| 2,680,226 | 6/1954 | Whitehead et al. | 324/3 |
| 2,929,984 | 3/1960 | Puranen et al. | 324/6 |
| 3,159,784 | 12/1964 | Haslett et al. | 324/34 |
| 3,488,579 | 1/1970 | Schonstedt | 324/245 |
| 3,500,175 | 3/1970 | Ronka | 324/3 |
| 3,521,153 | 7/1970 | Moss | 324/6 |
| 3,588,802 | 6/1971 | Lerwill | 340/15 |
| 3,594,633 | 7/1971 | Barringer | 324/6 |
| 3,614,600 | 10/1971 | Ronka | 324/4 |
| 3,617,865 | 11/1971 | Hakata | 324/3 |
| 3,617,866 | 11/1971 | Dowsett et al. | 324/4 |
| 3,636,435 | 1/1972 | Seigel | 324/6 |
| 3,676,772 | 7/1972 | Lee | 324/41 |
| 3,697,869 | 10/1972 | Greenberg et al. | 324/244 |
| 3,719,882 | 3/1973 | Pincus | 324/3 |
| 3,763,419 | 10/1973 | Barringer | 324/6 |
| 3,784,899 | 1/1974 | Chalfin | 324/6 |
| 3,836,952 | 9/1974 | Johnson | 340/15.5 |
| 3,866,111 | 2/1975 | Warren | 324/3 |
| 3,893,025 | 7/1975 | Humphreys, Jr. | 324/67 |
| 4,004,212 | 1/1977 | Wortman | 324/3 |
| 4,044,299 | 8/1977 | Weber | 324/3 |
| 4,085,360 | 4/1978 | Howell | 324/3 |
| 4,091,322 | 5/1978 | Stankoff | 324/67 |
| 4,095,167 | 6/1978 | Weber | 324/3 |
| 4,096,432 | 6/1978 | Spencer | 324/3 |
| 4,112,349 | 9/1978 | Weber | 324/3 |
| 4,128,803 | 12/1978 | Payne | 324/3 |
| 4,134,061 | 1/1979 | Gudgel | 324/54 |
| 4,161,686 | 7/1979 | Weber | 324/3 |
| 4,220,913 | 9/1980 | Howell et al. | 324/52 |
| 4,258,321 | 3/1981 | Neale, Jr. | 324/334 |
| 4,263,552 | 4/1981 | Weber | 324/326 |
| 4,295,095 | 10/1981 | Thomas et al. | 324/326 |
| 4,386,318 | 5/1983 | Burbank et al. | 324/225 |

FOREIGN PATENT DOCUMENTS 0122938 9/1981 Japan ........................ 324/238

OTHER PUBLICATIONS

"Model Mac-5113 Magnetic and Cable Locator" instruction manual, May 1985.

Primary Examiner—Ernest F. Karlsen
Assistant Examiner—Walter E. Snow
Attorney, Agent, or Firm—Shapiro and Shapiro

[57] ABSTRACT

In locating current-carrying objects, such as buried pipes in the presence of extraneous magnetic fields by detecting the magnetic field produced by the current, first and second spaced primary sensors measure the magnetic field at first and second locations, and a compensating sensor measures the extraneous field at a location midway between the first and second locations. The signal from the compensating sensor is combined with the signals from both of the primary sensors so as to compensate for the extraneous magnetic field at the primary sensors. The invention compensates for ambient magnetic fields associated with propagating electromagnetic energy that induces current in an object, and compensates for extraneous magnetic fields produced by current flow in an adjacent object.

16 Claims, 8 Drawing Figures

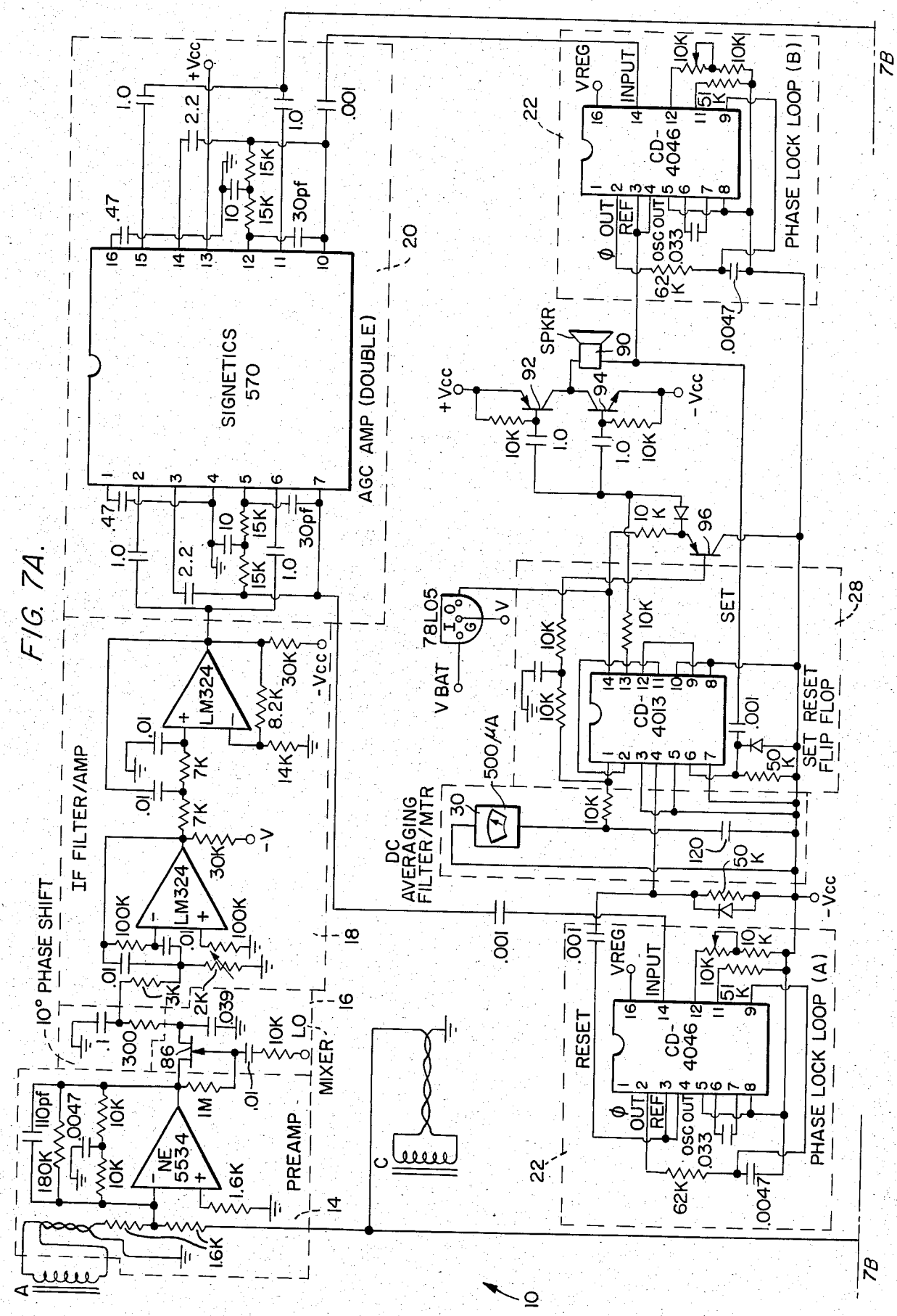

APPARATUS AND METHOD EMPLOYING EXTRANEOUS FIELD COMPENSATION FOR LOCATING CURRENT-CARRYING OBJECTS

BACKGROUND OF THE INVENTION

This invention relates to methods and apparatus for locating objects such as buried pipes, electrical cables and the like.

It is well known to locate underground objects such as pipes and electrical cables by detecting the magnetic field produced by currents flowing in such objects. If the object is accessible at some point, an RF source may be coupled to the object to excite an alternating current flow therein. The object may then be tracked using locating apparatus that responds to the frequency of the RF source by detecting the magnetic field produced by the current flow. Another convenient source of excitation current is propagating VLF electromagnetic energy such as produced by high-powered radio transmitters operating in the 14–30 KHz frequency band. Such propagating electromagnetic energy penetrates deeply below the earth's surface and will induce current flow in buried objects such as pipes or electrical cables. By detecting the magnetic fields associated with such current flow using apparatus tuned to the frequency of the propagating electromagnetic energy, the buried objects may be located.

Known methods and apparatus for locating buried objects by detecting the magnetic fields associated therewith are subject to error because of extraneous ambient fields. Known locating apparatus typically comprises two or more spaced magnetic field sensors for detecting the magnetic field at spaced locations. As the sensors pass over the buried object, the presence of the object is indicated by changes in the detected magnetic field at each sensor. However, extraneous ambient magnetic fields may produce similar changes in the magnetic fields at the sensors and cause errors in detecting the location of the buried object.

It is desirable, therefore, to provide methods and apparatus for locating current-carrying objects that avoid such problems, and it is to this end that the present invention is directed.

SUMMARY OF THE INVENTION

The invention affords apparatus and methods for locating current-carrying objects by detecting and measuring the magnetic field produced by such current, and which employ techniques for compensating for the effects of extraneous magnetic fields in order to avoid errors caused by such extraneous fields.

In accordance with one aspect, the invention affords apparatus for locating an object carrying current that comprises first and second sensor means arranged to measure at first and second locations, respectively, magnetic field values and for producing corresponding first and second signals representative of the magnetic field values, third sensor means for measuring the magnetic field value at a third location between the first and second locations and for providing a third signal representative of such value, means for combining the signals from the sensor means so as to produce a first resultant signal representative of the difference between the magnetic field value at the first location and the magnetic field value at the third location and so as to produce a second resultant signal representative of the difference between the magnetic field value at the second location and the magnetic field value at the third location, means for processing the resultant signals, and means responsive to the processing means for indicating the location of the object.

In accordance with another aspect, the invention affords a method of locating an object carrying current by detecting the magnetic field produced by such current that comprises measuring at first and second locations magnetic field values and producing corresponding first and second signals representative of such values, measuring at a third location between the first and second locations another magnetic field value and providing a third signal representative of such value, combining the signals so as to produce a first resultant signal representative of the difference between the magnetic field value at the first location and the magnetic field value at the third location and so as to produce a second resultant signal representative of the difference between the magnetic field value at the second location and the magnetic field value at the third location, processing the resultant signals, and indicating in response to said processing the location of the object.

BRIEF DESCRIPTION OF THE DRAWINGS

FIGS. 7A–B are a detailed schematic diagram illustrating a preferred implementation of the apparatus of FIG. 1.

DESCRIPTION OF THE PREFERRED EMBODIMENTS

The present invention is particularly well adapted for locating buried pipes or electrical cables carrying alternating current excited therein by an RF source, and will be described in that environment. However, this is illustrative of only one utility of the invention, and, as will become apparent, the invention may also be advantageously employed for other purposes.

Figure 1:
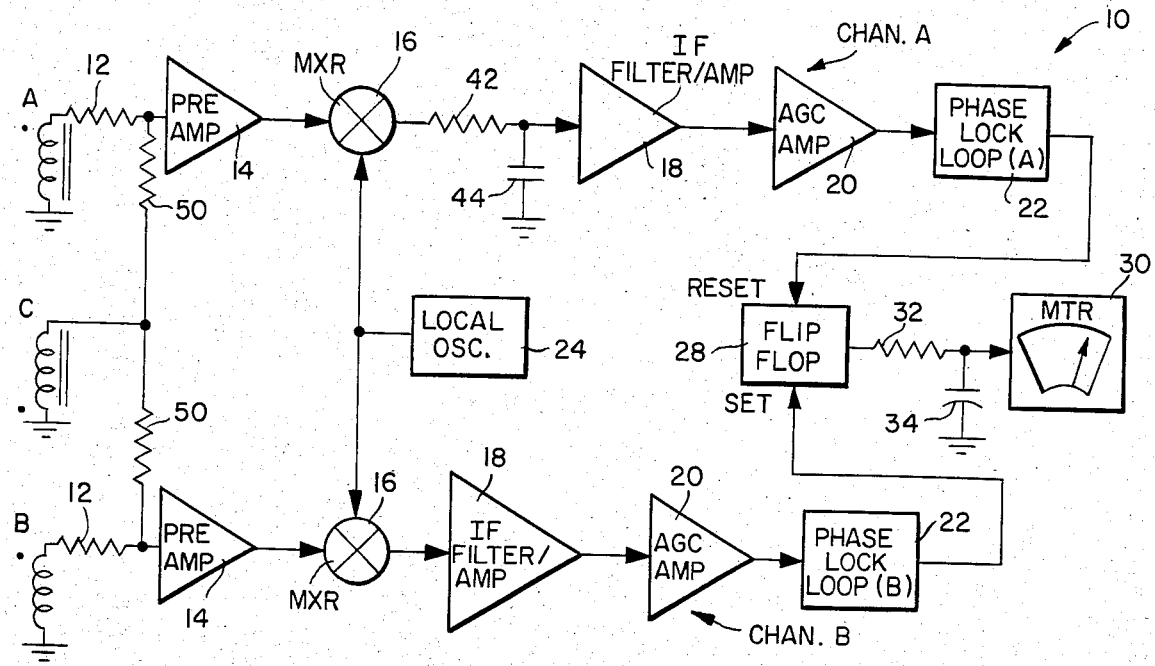
FIG. 1 is a block diagram of a first embodiment of locating apparatus in accordance with the invention.

FIG. 1 illustrates a locating apparatus 10 in accordance with a first embodiment of the invention. As shown, the apparatus, which is preferably battery powered so that it may be portable, may comprise a pair of primary magnetic field sensors A and B which are adapted to be oriented in a predetermined direction and disposed in fixed spatial relationship with respect to one another. The sensors measure the values of the magnetic fields in the predetermined direction at the spaced locations and provide corresponding output signals. Primary sensors A and B are preferably identical, so as to provide identical output signals when subjected to the same magnetic field, and may comprise coils of wire wound about magnetic cores. The sensors are preferably oriented with the magnetic axes of the cores parallel and in a vertical direction so as to respond to vertical magnetic fields, and they may be mounted on a movable structure (not shown) with a predetermined spacing therebetween. The apparatus also comprises a third, compensating magnetic field sensor C, which may also comprise a coil of wire wound about a magnetic core. As will be described in more detail hereinafter, compensating field sensor C is preferably disposed between the two primary field sensors with its magnetic axis vertical and parallel to the magnetic axes of the primary sensors. However, as indicated by the dots adjacent to the coils of each sensor in FIG. 1, the compensating field sensor is arranged to output a signal having an opposite polarity from the output signals supplied by the primary sensors. The purpose of the compensating sensor is to compensate for errors caused by extraneous ambient magnetic fields in the vicinity of the primary sensors. The manner in which this is accomplished will be described later.

The output signals from the primary sensors A and B may be supplied through resistors 12 to corresponding, substantially identical (except as noted hereinafter) processing channels A and B. As shown, each channel comprises, in series, a pre-amplifier 14, a mixer 16, an IF filter/amplifier 18, an AGC amplifier 20, and a phase lock loop (PLL) 22. Both mixers may be driven by a common local oscillator 24, and each channel comprises a superheterodyne receiver that may be tuned to a desired frequency by varying the frequency of the local oscillator. The local oscillator frequency is adjusted to tune to the frequency of the excitation source of an object, such as a pipe, to be located. Pre-amplifier 14 may be a bandpass amplifier having a passband selected to pass a frequency band of interest, and the IF filter/amplifier may be selected to have a convenient center frequency, e.g., 1.8 KHz, and a bandwidth of the order of several hundered Hertz. As will be described shortly, the apparatus of FIG. 1 may be employed for locating buried pipes or electrical cables having alternating current induced therein by propagating electromagnetic energy in the VLF frequency range, for example. On the East Coast of the United States, the U.S. Navy operates two high-powered VLF radio transmitters that operate at frequencies of 17.8 KHz and 21.4 KHz, which are convenient excitation sources for inducing current flow in the pipe or cable.

The AGC amplifiers 20 are employed to ensure that the signals supplied to phase lock loops 22 from their corresponding IF filter/amplifiers 18 have substantially the same level. The phase lock loops serve as filters to remove noise from the signals supplied by the AGC amplifiers, and each phase lock loop outputs a binary signal (that is a square wave signal when its input is a sine wave) that is in phase with its input signal. As shown in FIG. 1, the output from phase lock loop A (in channel A) is supplied to the RESET input of a flip flop 28, and the output from phase lock loop B is supplied to the SET input of the flip flop. The flip flop serves as a phase detector and provides an output signal to a meter 30 through a DC averaging network comprising a resistor 32 and a capacitor 34. When the flip flop is set, its output changes states, e.g., goes high, and the output remains at the set level until the flip flop is reset. Accordingly, the flip flop output is a binary signal which has a duty cycle that is related to the phase difference between its SET and RESET input signals. It is, therefore, desirable that, except as explained hereinafter, the phase shift through the components of the channels be the same. The DC averaging network converts the binary signal output of the flip flop to a DC voltage that is displayed on the meter.

Figure 2:
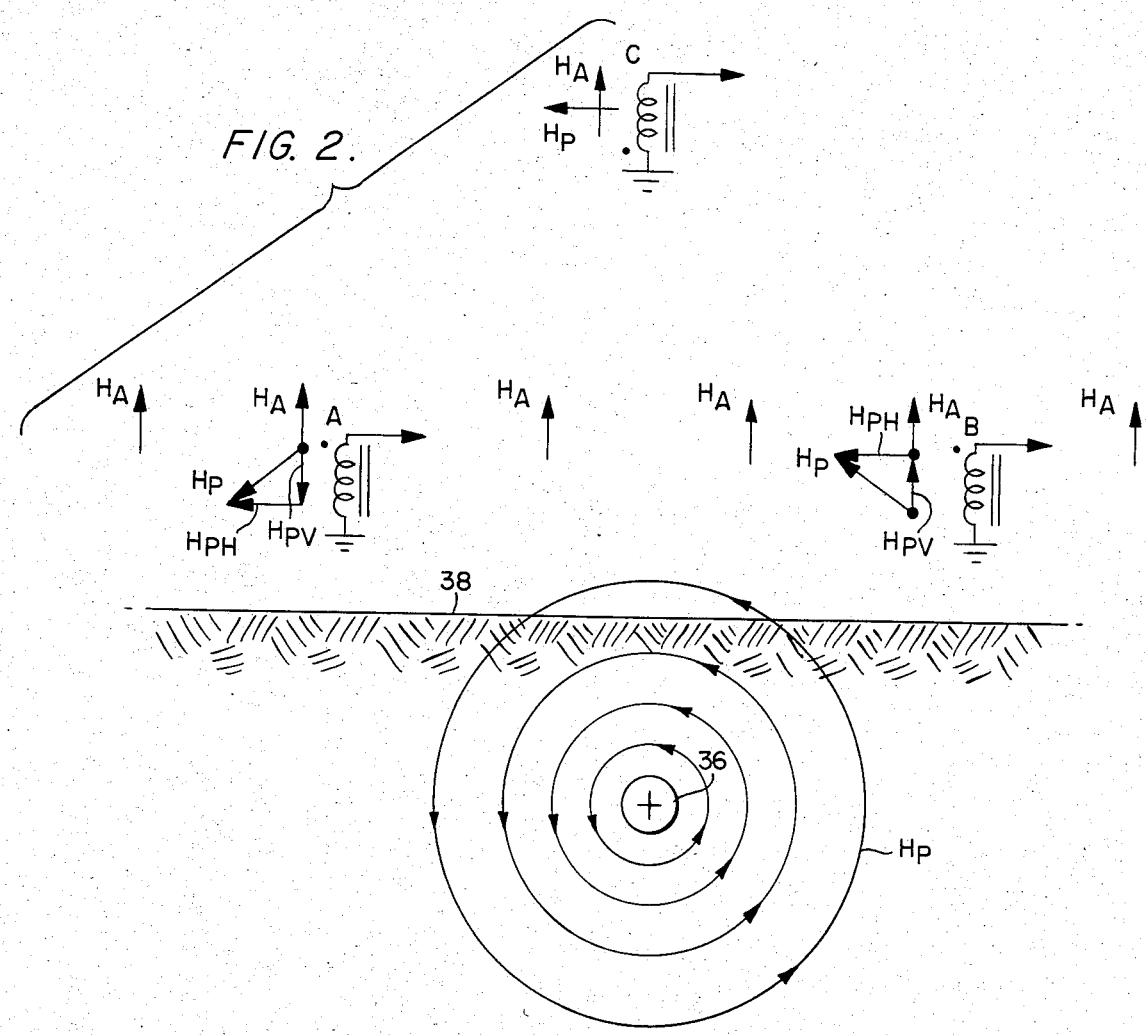
FIG. 2 is a diagrammatic view useful for explaining the operation of the apparatus of FIG. 1.

As will be explained in more detail shortly, and as is illustrated in FIG. 2, an induced current flowing in an elongated object, such as a pipe 36 buried beneath the surface 38 of the earth (the pipe extending normal to the plane of the drawing) produces a circumferential magnetic field Hp that extends about the longitudinal axis of the pipe. As indicated by the arrows on the magnetic field lines in the figure, at diametrically opposed locations the magnetic field is in opposite directions and, therefore, is opposite in phase. When the primary sensors A and B are both located on the same side of the pipe, the magnetic fields at the two sensors will be in phase and the output signals from the sensors will be in phase. However, when the sensors are located on opposite sides of the pipe, (as is illustrated in FIG. 2) the magnetic field at one of the sensors will be 180° out of phase with the magnetic field at the other sensor, and the output signals from the two sensors will likewise be 180° out of phase. If the cumulative phase shifts through both processing channels A and B are identical, the SET and RESET input signals to the flip flop will occur simultaneously when the output signals from the sensors are in phase and the flip flop will remain in a reset state at which its output may be 0 volts, for example. Conversely, when the signals from the sensors are 180° out of phase, the flip flop will be in a set state for 180° of each 360° period so that the average (DC) voltage to the meter will be of the order of one-half the set voltage level. Accordingly, by moving the sensors over the earth's surface, the location of the pipe can be determined by detecting the change in voltage indicated on the meter when the sensors pass over and straddle the pipe.

When the output signals from the sensors are in phase and the cumulative phase shifts through each processing channel are identical so that the SET and RESET inputs to the flip flop occur simultaneously, noise or other extraneous disturbances may produce momentary phase shifts between the SET and RESET inputs to the flip flop, which may produce large, rapid flucuations in the duty cycle of the flip flop output signal and corresponding instability in the meter reading. To avoid this, a phase shift network comprising a resistor 42 and a capacitor 44 may be inserted into processing channel A of the apparatus of FIG. 1 between the mixer 16 and the IF filter/amplifier 18 in order to delay slightly, e.g., by 10°, the phase of the RESET input to the flip flop with respect to its SET input.

Figure 3:
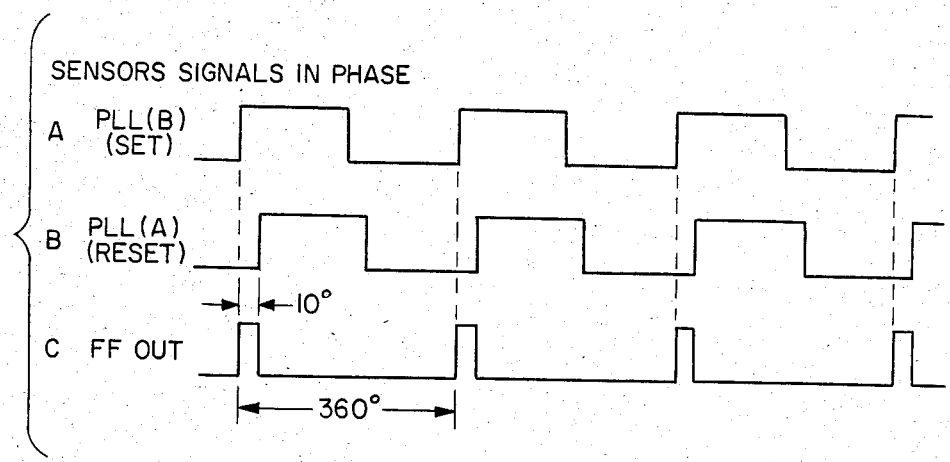
FIGS. 3 and 4 are diagrams illustrating waveforms at certain points in the apparatus in FIG. 1 when the magnetic fields detected by magnetic field sensors of the apparatus are, respectively, in phase and 180° out of phase.
Figure 4:
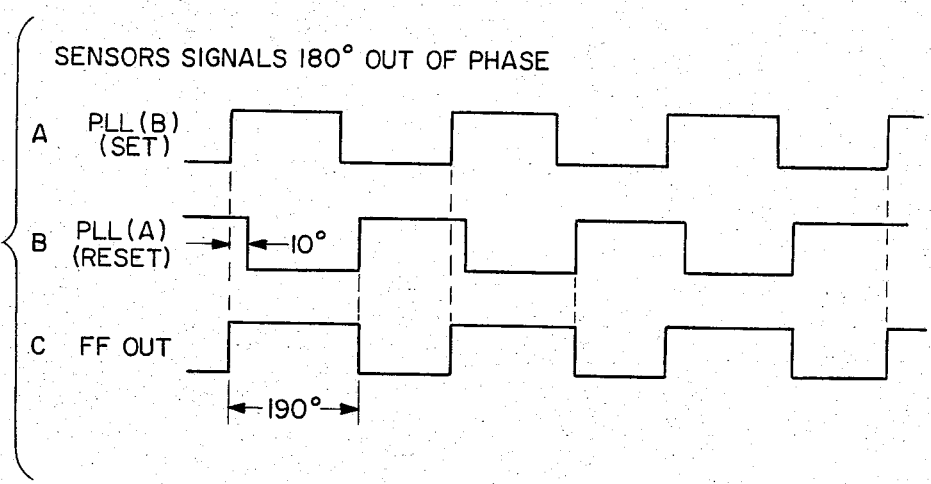

FIGS. 3 and 4 illustrate the operation of the apparatus of FIG. 1 when the RESET input to the flip flop has its phase delayed 10°. In the figures, it is assumed that the flip flop is set and reset on positive-going transitions, and that, when set, its output is high. As shown in FIG. 3, when the signals from the two primary sensors are in phase, the positive-going SET input to the flip flop from phase lock loop B will lead the positive-going RESET input from phase lock loop A by an amount determined by the phase shift network, i.e., 10°. Accordingly, the flip flop will be set high for approximately 10° of each 360° period. The DC averaging network will accordingly output a small non-zero DC voltage (approximately 1/36th of the set voltage level) to the meter. In contrast, as shown in FIG. 4, when the signals from the two sensors are 180° out of phase, the flip flop will be high for 190° of each 360° period, and the DC averaging network will provide a DC voltage of the order of 19/36th of the set voltage level to the meter. The meter may be calibrated so that this latter voltage corresponds to a full scale deflection. Accordingly, when the two primary sensors are on the same side of the pipe, the meter indication will be a minimum, and when the two sensors straddle the pipe, the meter indication will be a maximum. Of course, the flip flop output may be inverted, if desired, so that the meter has a null when the sensors straddle the pipe.

Without the compensating sensor C, the apparatus of FIG. 1 is subject to error when the primary sensors are in the presence of extraneous magnetic fields. This may be best illustrated by reference to FIG. 2, assuming for the moment that the compensating sensor C is not present, by describing the operation of the apparatus when the pipe 36 is excited by propagating VLF electromagnetic energy, such as produced by a high-powered VLF transmitter. As previously described, each of the primary sensors responds to the vertical component of the magnetic field that is present at its location, and outputs a signal that has a magnitude that is a function of the strength of the vertical component of the magnetic field and that has a phase that is a function of the direction of the vertical magnetic field component. As is shown in the figure, at the location of each of sensors A and B, the circumferential magnetic field HP resulting from the induced current flow in pipe 36 may be resolved into a vertical component $H_{PV}$ and a horizontal component $H_{PH}$. On opposite sides of the pipe, the vertical components are in opposite directions and, therefore, are 180° out of phase. When the primary sensors are equally spaced from the pipe, the magnitudes of the vertical components will be the same. Thus, the output signals from primary sensors A and B due to the vertical components of the circumferential magnetic field will be equal and 180° out of phase for the locations shown.

However, the propagating electromagnetic energy also has associated therewith an ambient vertical magnetic field component $H_A$. This ambient magnetic field component is in phase and has the same magnitude at both of the primary sensors, and combines with the vertical component $H_{PV}$ of the circumferential magnetic field present at each sensor to produce a resultant vertical field at each sensor. For the situation illustrated in FIG. 2, the ambient field and the vertical component of the circumferential field are in opposite directions, i.e., 180° out of phase, at sensor A and are in the same direction, i.e., in phase, at sensor B. Thus, the resultant vertical field at sensor A is reduced and that at sensor B is increased. Depending upon the relative magnitudes of the ambient field and the vertical component of the circumferential field, the ambient field may entirely cancel the vertical component of the circumferential field at sensor A, or may even cause the resultant field at sensor A to reverse direction so that the resultant fields at both sensors A and B are in phase, thereby leading to errors in locating the position of the pipe.

This problem is avoided by the compensating sensor C. As is shown in FIG. 2, compensating sensor C is preferably disposed along a line (not shown) that is normal to a line connecting the primary sensors that is midway between the primary sensors and is arranged with its magnetic axis parallel to the magnetic axes of sensors A and B. To compensate for errors due to an ambient magnetic field produced by propagating electromagnetic energy, sensor C is preferably located above the horizontal level of the two primary sensors, as shown, and preferably the three sensors are located on the vertices of an isosceles triangle, with sensors A and B at the base of the triangle, the sides of which may be of the order of 2 feet long, for example. Each of the three sensors responds to the resultant vertical magnetic field that is present at its location, and outputs a signal that has a magnitude related to the field strength and a phase that is a function of the direction of the resultant vertical magnetic field at its location. Sensor C measures the value of the vertical ambient field and outputs a corresponding signal that is 180° out of phase with the signals from sensors A and B due to the ambient field. The signal from sensor C is a compensating signal that is fed through resistors 50 to the summing junctions of pre-amplifiers 14, as shown in FIG. 1, where it is combined with the signals from the primary sensors A and B. The compensating signal from sensor C, which corresponds to the value of the ambient vertical magnetic field, is thus subtracted from the signals output by each of the primary sensors, thereby compensating for the portion of the output signal from each primary sensor that is due to the ambient field. In effect, this serves to cancel the ambient field so that the signals from the primary sensors that are processed by the apparatus correspond to only the values of the vertical component of the circumferential magnetic field at the sensors, thereby eliminating errors caused by the ambient field. When the compensating sensor C is positioned directly over the pipe (as shown in FIG. 2) the circumferential magnetic field has no vertical component (it is entirely horizontal). As the sensor array is moved to one side or the other, of the pipe, there will be some vertical component of the circumferential magnetic field present at sensor C. However, since the field strength of the circumferential magnetic field decreases with distance from the pipe, by locating sensor C above the horizontal level of the primary sensors, the vertical component of the circumferential magnetic field will be smaller than the vertical components at the horizontal level of the primary sensors and will not significantly affect the output signals from the primary sensors.

Figure 5:
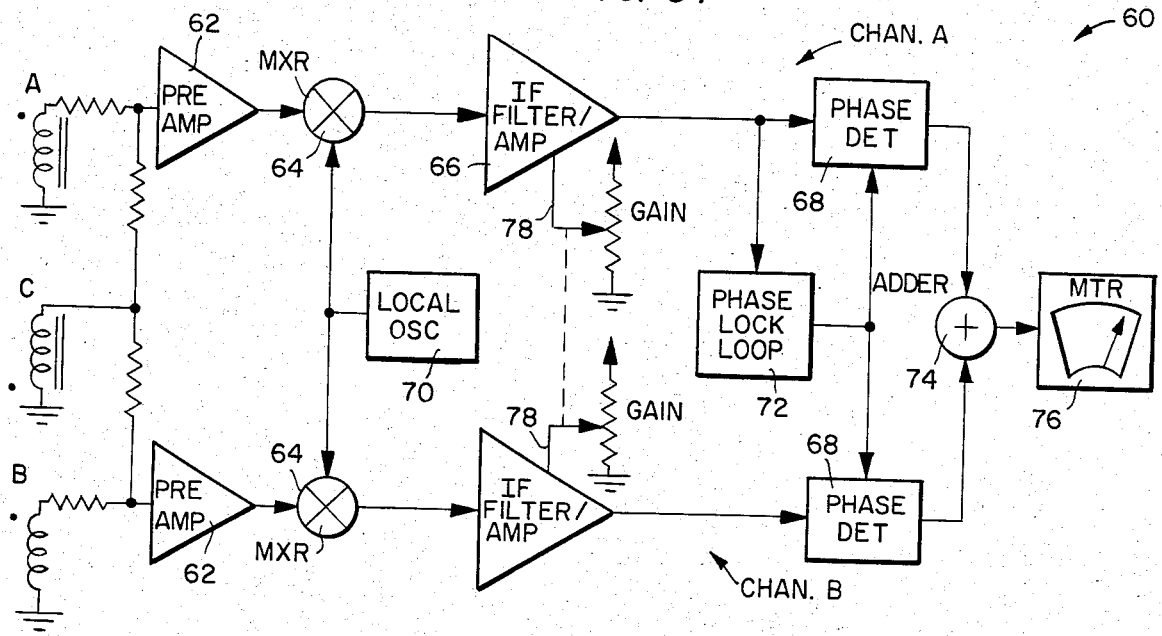
FIG. 5 is a block diagram of a second embodiment of the invention.

FIG. 5 illustrates a second embodiment of a locating apparatus 60 in accordance with the invention. The apparatus of FIG. 5 is somewhat similar to that of FIG. 1, and may include substantially identical processing channels A and B for processing the signals from primary sensors A and B. As shown, each channel may comprise, in series, a pre-amplifier 62, a mixer 64 an IF filter/amplifier 66 and a phase detector 68. As in the apparatus of FIG. 1, a common local oscillator 70 may drive both mixers, and each channel essentially comprises a superheterodyne receiver that may be tuned to a desired frequency. The apparatus further comprises a phase lock loop 72 which receives an input from one channel, e.g., channel A, and provides a common output to the phase detectors 68. The outputs from the phase detectors, which are DC voltages, are added together in an adder 74 and then applied to a meter 76. The phase lock loop and the phase detectors serve to filter the signals in each of the channels, and the DC voltages from the phase detectors are related to the amplitude of the signal in each channel. Thus, the output voltage to the meter corresponds to the sum of the magnitudes of the signals in the two channels.

As noted earlier, the apparatus of FIG. 1 is essentially a phase detector that determines the location of the pipe by detecting the phase difference between the signals output from the primary sensors. The apparatus of FIG. 5, however, is essentially an amplitude detector that compares the amplitudes of the signals from the two primary sensors to determine the location of the pipe. When the primary sensors are equally spaced on opposite sides of the pipe (such as shown in FIG. 2) their output signals will have the same magnitude but will be 180° out of phase, as previously described. Thus, the signals will cancel in adder 74 and its output will be zero. Accordingly, the meter will have a null. When the sensors are moved to either the left or the right, the amplitudes of the signals from the sensors will vary in accordance with the variation in the vertical components of the magnetic field, and the output from the adder will go either positive or negative depending upon the direction of movement. By using a meter that has a center null position and which responds to both positive and negative voltages, the meter will provide a left and a right indication of the location of the pipe with respect to the sensors. AGC amplifiers are not employed in the apparatus of FIG. 5, since it is necessary to preserve the amplitudes of the signals flowing through each processing channel. Rather, ganged manual gain controls 78 may be employed for controlling the gains of the IF filter/amplifiers 66. The ganged gain controls allow the sensitivity of the apparatus to be adjusted while maintaining the gains of the two IF filter/amplifiers equal.

As may be appreciated from the foregoing discussion of the operation of the apparatus of FIG. 1, the apparatus of FIG. 5 is also subject to error when the primary sensors are in the presence of extraneous magnetic fields, since the magnitudes of the signals from the sensors are related to the magnitudes of the resultant vertical components of the magnetic fields at the sensors. Thus, the apparatus of FIG. 5 also includes a third compensating sensor C for compensating for errors caused by extraneous fields, as will be described shortly.

The apparatus of FIG. 5 may be used for locating and tracking a buried pipe or cable that is accessible at some point so that it can be excited by a local RF transmitter coupled to the pipe or cable. In this case, there may be no ambient vertical magnetic field due to the excitation source, as there is when propagating electromagnetic energy is used as the excitation source. However, it is often neccessary to locate a pipe or cable that is adjacent to one or more other pipes or cables. Under these circumstances, energy from the local RF transmitter may be parasitically coupled to a second pipe or cable and induce a current flow therein which will produce a circumferential magnetic field about the second pipe or cable. This extraneous magnetic field from the second pipe or cable may spill over to the pipe or cable under test and may tend to cancel or reinforce the magnetic field on one side of the pipe or cable under test, thereby causing an apparent shift in the location of the null. Such errors can be avoided or minimized by the compensating sensor C.

In using the apparatus of FIG. 5 to compensate for errors caused by extraneous magnetic fields due to adjacent pipes or cables, compensating sensor C is preferably disposed midway between the primary sensors and on a line connecting the primary sensors. The compensating sensor measures the vertical magnetic field at the midpoint between the two primary sensors and provides an output signal having a magnitude corresponding to the magnitude of the field but of opposite phase (as indicated by the dots adjacent to each coil in FIG. 5). The compensating signal from sensor C is combined with the signals from primary sensors A and B at the summing junctions of pre-amplifiers 62, thereby subtracting the compensating signal from each primary sensor signal. In effect, this causes twice the value of the magnetic field at the compensating sensor to be subtracted from the sum of the magnetic field values measured by the two primary sensors A and B. Assuming that the interfering pipe or cable is located far enough from the sensor array such that the amplitude of its extraneous field decreases approximately linearly across the sensors with distance, then twice the signal at the center point midway between the primary sensors due to the extraneous magnetic field equals the sum of the primary sensor signals due to the extraneous magnetic field. In the absence of an interfering pipe or cable, this arrangement does not move the null, since the vertical signal directly over a driven pipe or cable is zero.

Figure 6:
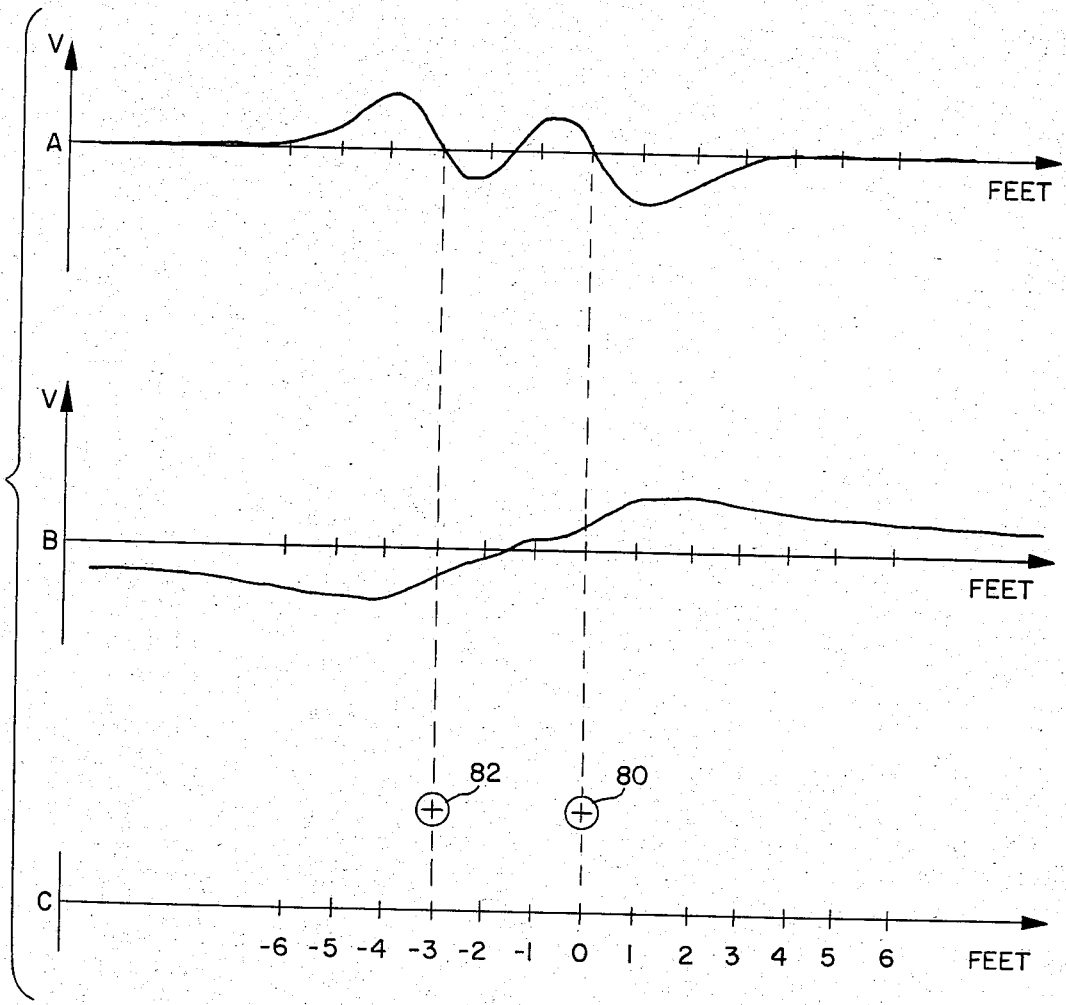
FIGS. 6A–C are diagrams illustrating the improved performance afforded by the apparatus of FIG. 5 over a similar apparatus that does not employ a compensating sensor in locating each of two adjacent current-carrying pipes.

FIG. 6A illustrates the improvement afforded by the apparatus of FIG. 5 over a similar apparatus that does not employ a compensating sensor (the curve of FIG. 6B) in detecting the locations of two adjacent buried pipes 80, 82 spaced three feet apart (as shown in FIG. 6C) which carry the same current. The curve of FIG. 6A illustrates the output voltage of adder 74 of the apparatus of FIG. 5 as the sensor array is moved across the two pipes. The curve of FIG. 6B illustrates the output of a similar apparatus that does not include the compensating sensor C as the sensor array is moved across the pipes. The curves correspond to the primary sensors being spaced two feet apart. As shown in FIG. 6B, the two-sensor apparatus does not indicate a null over either pipe but has a null located approximately midway between the two pipes. In contrast, as shown in FIG. 6A, the three-sensor apparatus of FIG. 5 has a null over each pipe, thereby indicating the location of each pipe. It also has a virtual null that occurs at approximately the midpoint between the two pipes. In actual practice, the virtual null may be easily identified since as the sensor array is moved in a given left or right direction from a virtual null, the voltage applied to the meter will have an opposite polarity from the polarity it would have upon moving in the same direction from a real null (as illustrated by the curve of FIG. 6A), thus causing the needle of the meter to deflect in the opposite direction. In normal use for tracking a buried pipe that is excited by a local RF transmitter, the locating apparatus is moved away from the transmitter (as by the operator walking away from the transmitter with his back thereto) so that the meter may be marked with left and right indications on its face to show the direction of the pipe with respect to the center of the sensor array.

Figure 7B:
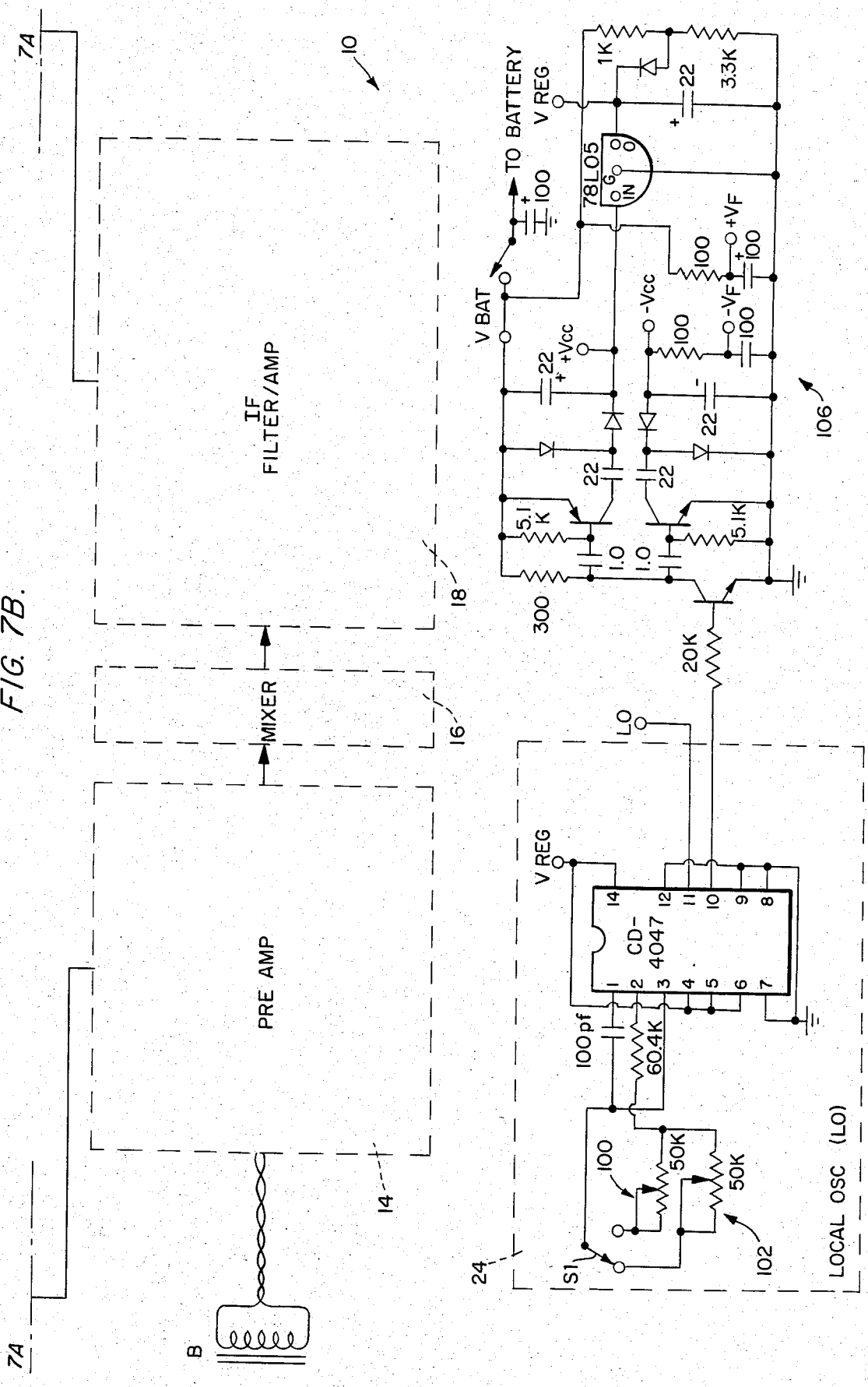

In view of the foregoing, it will be apparent to those skilled in the art that apparatus in accordance with the invention may be implemented in a number of different ways. FIGS. 7A-B illustrate schematically a preferred implementation of the locating apparatus of FIG. 1 using integrated circuits. Unless otherwise indicated, in FIGS. 7A-B resistance values are given in ohms and capacitance values are given in microfarads. Primary sensors A and B, which as indicated previously are preferably identical, may comprise 715 turns of number 34 wire wound upon a 5/16 inch diameter by 7½ inch length magnetic core. Compensating sensor C may similarly comprise a coil of wire wound upon the same type of magnetic core, but preferably has one-half the number of turns as sensors A and B. The reason for this is the voltage induced in each sensor coil is proportional to the magnetic field strength and the number of turns, whereas the current output from the coil is proportional to the reciprocal of its impedance, which is proportional to the square of the number of turns. Since the summing junction input to each of the pre-amplifiers is a virtual ground, for proper compensation it is desirable that current flowing into each summing junction from sensor C be the same as the current flowing into that junction from the primary sensor connected thereto when both the primary sensor and the compensating sensor experience the same magnetic field. Accordingly, since the current output from the compensating sensor is divided in two, its output current must be twice the output current from each of the primary sensors. This is accomplished by winding the compensating sensor with one-half the number of turns as the primary sensors. Moreover, as previously indicated, since the current supplied by the compensating sensor must be 180° out of phase with that supplied by a primary sensor (when the magnetic fields at each sensor are in phase), the compensating sensor is arranged such that its output current has the opposite polarity (as by winding the coil in the opposite direction) from the output current of the primary sensors.

As shown in FIG. 7A, pre-amplifier 14 may comprise a Signetics type NE 5534 op amp, and the outputs from sensors A and C may be connected to its inverting input. An RC feedback network, such as illustrated in the figure, may be connected between the output of the op amp and its inverting input to establish a desired passband. The component values of the RC network indicated in the figure afford a passband sufficient to pass both the 17.8 and the 21.4 KHz VLF signals.

Mixer 16 may comprise a T1S75 FET 86 connected to the output of the op amp, and the local oscillator (LO) may be input on its gate. A conventional balanced mixer may be employed instead, if desired. The output of the mixer is supplied to the phase shift network, which may comprise a 300 ohm resistor and a 0.1 microfarad capacitor.

The IF filter/amplifier 18 may comprise a pair of National Semiconductor type LM 324 op amps that are connected in series as shown and have feedback RC networks with component values selected to provide a desired IF center frequency. The component values illustrated in the figure set the center frequency at 1.8 KHz. The 2K ohm potentiometer on the inverting input of the first op amp enables the IF frequency to be adjusted.

A Signetics type 570 dual compander, configured as shown, may be employed as the AGC amplifiers 20 for the channels (one-half of the integrated circuit being used for each channel). The outputs from the AGC amplifier corresponding to each channel are supplied to respective phase lock loops 22, which may be RCA type CD 4046 integrated circuits. The input to each phase lock loop is supplied on pin 14, and its output (labeled OSC OUT) is taken from pin 4, which is the output of the internal oscillator of the phase lock loop. The output is also fed back as a reference input to pin 3, as shown. The phase output from pin 2 of the phase lock loop (a DC voltage) is coupled back to pin 9 through a 62K ohm resistor and serves as an oscillator frequency control.

Flip flop 28 may comprise one-half of an RCA type CD 4013 set-reset flip flop. The output from phase lock loop B (labeled SET) is AC coupled via a 0.001 microfarad capacitor to the SET input (pin 6) of the flip flop, and the output of the phase lock loop A (labeled RESET) is AC coupled via another 0.001 microfarad capacitor to the RESET input (pin 4) of the flip flop. The output of the flip flop is taken from pin 1 and is supplied to the DC averaging network comprising a 10K ohm resistor and a 120 microfarad capacitor, and then to meter 30.

If desired, the other half of the CD 4013 integrated circuit may be connected, as shown, to form a D-type flip flop having an output on pin 13 which drives a speaker 90 (for providing an audible output) via a pair of transistors 92,94, connected in push-pull configuration. Another transistor 96 havings its base connected to pin 1 of the integrated circuit via a pair of 10K ohm resistors and having its emitter coupled to pin 14 and to the output of a type 78L05 voltage regulator may be employed for clipping the input to the push-pull transistors so as to vary the drive applied to the speaker in accordance with the duty cycle of the signal on the output of pin 1 of the flip flop.

The pre-amplifier 14, mixer 16, and IF filter/amplifier 18 of channel B may be identical to corresponding units of channel A. Accordingly, they need not be described and are illustrated in FIG. 7B as dotted-line blocks.

As is also shown in FIG. 7B, local oscillator 24 may comprise an RCA type CD 4047 integrated circuit configured as shown. In the form illustrated, the local oscillator may output either of two frequencies selectable by a switch S1 that selects either of two variable potentiometers 100, 102. The precise output frequencies of the local oscillator are determined by the settings of the potentiometers, which may be adjusted to provide the correct local oscillator frequencies for the 17.8 KHz and the 21.4 KHz VLF signals. Of course, other frequencies may also be provided, e.g., to receive the frequency of the local transmitter employed for exciting the pipe, and the local oscillator may be configured to afford a continously variable output frequency. The output of the local oscillator on pin 11 is a square wave and is applied to the two mixers. If desired, a local oscillator having a sine wave output may be employed instead.

Also shown in FIG. 7B is a generally conventional voltage-doubling DC-DC converter 106 for providing both positive and negative output voltages from a battery, and incorporating a type 78L05 voltage regulator for providing a regulating output voltage.

While preferred embodiments of the invention have been shown and described, it will be apparent to those skilled in the art that changes can be made in the embodiments without departing from the principles and spirit of the invention, the scope of which is defined in the appended claims.

The invention claimed is:

1. Apparatus for locating an obscured elongated object carrying current induced therein by electromagnetic energy propagated from a remote source, the current producing a circumferential magnetic field, comprising first and second sensor means arranged to measure at first and second locations, respectively, a component of said magnetic field and for producing corresponding first and second signals, respectively, portions of said signals being due to measuring by said first and second sensor means of a magnetic field component of said propagated electromagnetic energy, third sensor means for measuring at a third location between the first and second locations said magnetic field component of said propagated electromagnetic energy and for producing a corresponding third signal, said first, second, and third sensor means being positioned at the vertices of an isosceles triangle, with the first and second sensor means located at the base of the triangle, the sensor means having a fixed positional relationship with respect to one another and being movable as a group relative to said object and relative to said remote source, means for combining the signals from the sensor means so as to produce a first resultant signal representative of subtraction of the magnetic field component measured at the third location from the magnetic field components measured at the first location and so as to produce a second resultant signal representative of subtraction of the magnetic field component measured at the third location from the magnetic field components measured at the second location, means for processing the resultant signals, and means responsive to the processing means for indicating the location of the object.

2. The apparatus of claim 1, wherein the sensor means are arranged to measure vertical magnetic field components.

3. The apparatus of claim 1, wherein each of the sensor means comprises a coil wound upon a magnetic core oriented to have a vertical magnetic axis.

4. The apparatus of claim 3, wherein the coil of the third sensor means has one-half the number of turns of the coil of each of the first and second sensor means so as to supply a current output from the third sensor means that is twice the current output from each of the first and second sensor means.

5. The apparatus of claim 1, wherein the processing means comprises means for comparing the phases of the first and second resultant signals.

6. The apparatus of claim 5, wherein the processing means supplies to the indicating means a signal corresponding to the phase difference between the first and second resultant signals.

7. The apparatus of claim 6, wherein the processing means includes means for shifting the phase of the first resultant signal with respect to the second resultant signal prior to said comparing.

8. Apparatus for locating an obscured elongated object carrying current excited therein by a source of electromagnetic energy coupled to the elongated object, the current in said object producing a circumferential magnetic field that parasitically induces a current in a nearby object, whereby an interfering magnetic field is produced, said apparatus comprising first, second, and third sensor means arranged to measure at first, second, and third locations, respectively, a component of said magnetic fields and for producing corresponding first, second, and third signals, respectively, said third sensor means being located midway of a line connecting said first and second locations, said sensor means being movable as a group relative to said objects and relative to said source, means for combining the signals from the sensor means so as to produce a first resultant signal representative of subtraction of the magnetic field components measured at the third location from the magnetic field components measured at the first location and so as to produce a second resultant signal representative of subtraction of the magnetic field components measured at the third location from the magnetic field components measured at the second location, and so that twice the magnetic field components measured at the third location is effectively subtracted from the sum of the magnetic field components measured at the first and second locations, means for processing the resultant signals, and means responsive to the processing means for indicating the location of the object.

9. The apparatus of claim 8, wherein the processing means comprises means for detecting amplitude values of the first and second resultant signals and producing the sum of the amplitude values, and wherein the indicating means is responsive to said sum.

10. A method of locating an obscured elongated object, comprising inducing in the object a current from electromagnetic energy propagated from a remote source so as to produce a circumferential magnetic field, providing first, second, and third magnetic field sensors positioned at the vertices of an isosceles triangle with the first and second sensors located at the base of the triangle, moving said sensors as a group relative to the object and relative to the source, employing said first and second sensors to measure a magnetic field component of said circumferential magnetic field and to produce corresponding first and second signals, respectively, portions of said signals being due to measuring by said first and second sensors of a magnetic field component of said propagated electromagnetic energy, employing said third sensor to measure said magnetic field component of said propagated electromagnetic energy and to produce a corresponding third signal, combining said signals so as to produce a first resultant signal representative of subtraction of the magnetic field component measured by the third sensor from the magnetic field components measured by the first sensor and so as to produce a second resultant signal representative of subtraction of the magnetic field component measured by the third sensor from the magnetic field components measured by the second sensor, processing the resultant signals, and indicating in response to said processing the location of the object.

11. The method of claim 10, wherein said processing comprises measuring a phase difference between said first and second resultant signals, and providing an output signal corresponding to said phase difference.

12. A method of locating an obscured elongated object, comprising coupling a source of electromagnetic energy to the object and exciting a current therein which produces a circumferential magnetic field, providing first, second, and third magnetic field sensors at respective locations with the third sensor location midway of a line connecting the first and second sensor locations, moving the sensors as a group relative to said object and relative to said source, employing the sensors to measure magnetic field components at said locations and to produce corresponding signals, combining the signals so as to produce a first resultant signal representative of subtraction of the measured magnetic field components at the third location from the measured magnetic field components at the first location and so as to produce a second resultant signal representative of subtraction of the measured magnetic field components at the third location from the mcasured magnetic field components at the second location, processing the resultant signals, and indicating in response to the processing the location of the object.

13. The method of claim 12, wherein the processing comprises detecting amplitude values of the first and second resultant signals and producing the sum of the amplitude values, and wherein the indicating is responsive to said sum.

14. A method of locating an obscured elongated object, comprising inducing in the object a current from electromagnetic energy propagated from a remote source so as to produce a circumferential magnetic field, providing first, second, and third magnetic field sensors, positioning the first and second sensors so as to measure both a component of said circumferential magnetic field and a component of a magnetic field of said electromagnetic energy at first and second locations, respectively, positioning the third sensor relative to the first and second sensors so as to measure said magnetic field component of said propagated electromagnetic energy at a third location and so that the third sensor is relatively insensitive to the circumferential magnetic field, moving said sensors as a group relative to the object and relative to the source, producing respective first, second, and third signals from said sensors as the result of the measurements at the respective locations, combining said signals so that the signal produced by said third sensor compensates for the portions of the signals produced by said first and second sensors corresponding to the magnetic field component of said propagated electromagnetic energy measured by said first and second sensors, and processing the combined signals so as to indicate the location of the object.

15. A method of locating an obscured elongated object in the presence of a nearby further object, comprising coupling a source of electromagnetic energy to the elongated object and exciting a current therein which produces a circumferential magnetic field that induces a current in the further object parasitically and thereby produces an interfering magnetic field, providing first, second, and third magnetic field sensors at respective locations, moving the sensors as a group in said fields relative to said objects and relative to said source, employing the sensors to measure components of said magnetic fields at said locations and to produce corresponding signals representative of the measured magnetic field components, combining said signals so that the signal from said third sensor compensates for the portions of the signals from said first and second sensors that correspond to the interfering magnetic field measured at said first and second locations, and processing the combined signals so as to indicate the location of the elongated object.

16. A method in accordance with claim 15, wherein said third location is midway of a line connecting said first and second locations, and wherein said signals are combined so as to subtract twice the signal from the third sensor from the sum of the signals from the first and second sensors.

* * * * *